(12) United States Patent
Matsumoto et al.

(10) Patent No.: US 11,282,771 B2
(45) Date of Patent: Mar. 22, 2022

(54) ELECTRONIC COMPONENT AND METHOD OF MANUFACTURING ELECTRONIC COMPONENT

(71) Applicant: SHINKO ELECTRIC INDUSTRIES CO., LTD., Nagano (JP)

(72) Inventors: Takayuki Matsumoto, Nagano (JP); Tsukasa Nakanishi, Nagano (JP); Tadaaki Katsuyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/671,532

(22) Filed: Nov. 1, 2019

(65) Prior Publication Data

US 2020/0152556 A1 May 14, 2020

(30) Foreign Application Priority Data

Nov. 8, 2018 (JP) .............................. JP2018-210652

(51) Int. Cl.
| | | |
|---|---|---|
| *H01L 23/495* | (2006.01) | |
| *H01L 23/498* | (2006.01) | |
| *H01L 23/31* | (2006.01) | |
| *H01L 23/00* | (2006.01) | |

(52) U.S. Cl.
CPC .... *H01L 23/49537* (2013.01); *H01L 23/3192* (2013.01); *H01L 23/49861* (2013.01); *H01L 24/82* (2013.01); *H01L 2224/8282* (2013.01)

(58) Field of Classification Search
CPC ........... H01L 23/49537; H01L 23/3192; H01L 23/49861; H01L 24/82; H01L 2224/8282
See application file for complete search history.

(56) References Cited

U.S. PATENT DOCUMENTS

| | | | | |
|---|---|---|---|---|
| 6,043,430 | A * | 3/2000 | Chun | .................. H01L 23/3107 174/530 |
| 7,425,755 | B2 * | 9/2008 | Liu | .................... H01L 23/49551 257/666 |
| 2011/0058342 | A1 * | 3/2011 | Kawakita | ............ H01L 23/3135 361/735 |
| 2011/0101542 | A1 * | 5/2011 | Camacho | ................ H01L 24/16 257/778 |
| 2011/0285009 | A1 * | 11/2011 | Chi | ....................... H01L 21/561 257/693 |
| 2015/0237721 | A1 * | 8/2015 | Choh | .................... H01L 25/105 361/773 |

FOREIGN PATENT DOCUMENTS

| | | |
|---|---|---|
| JP | 2014-096446 | 5/2014 |
| JP | 2015-135940 | 7/2015 |

* cited by examiner

*Primary Examiner* — Peniel M Gumedzoe
(74) *Attorney, Agent, or Firm* — Rankin, Hill & Clark LLP

(57) ABSTRACT

An electronic component includes a metal member, an inductor, and a encapsulating resin. The metal member has an outer lead, an inner lead provided at a position opposed to the outer lead, and a post connecting the outer lead with the inner lead. The inductor is provided between the outer lead and the inner lead and connected to the outer lead or the inner lead. The encapsulating resin encapsulates the metal member and the inductor.

19 Claims, 23 Drawing Sheets

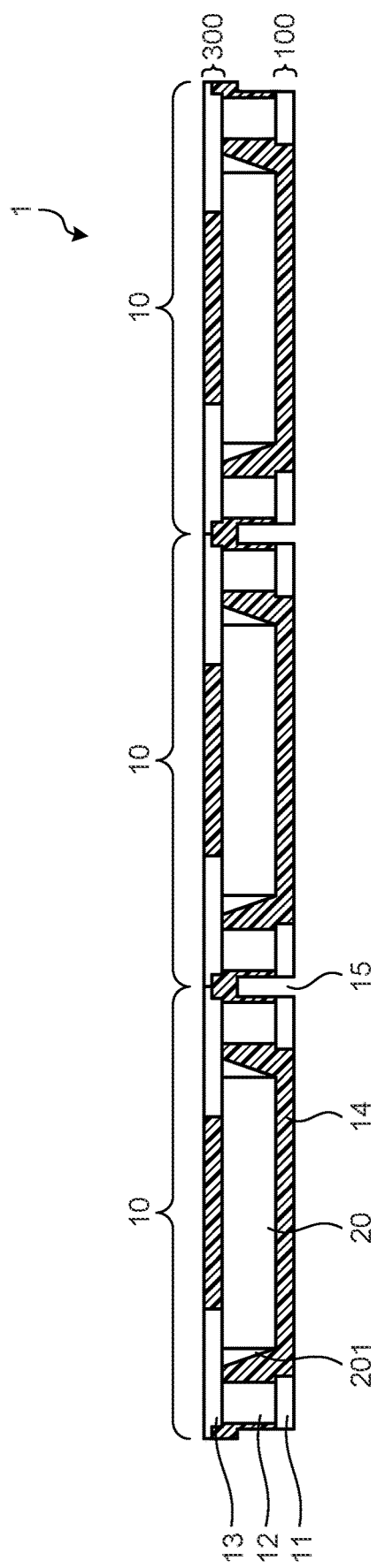

US 11,282,771 B2

ELECTRONIC COMPONENT AND METHOD OF MANUFACTURING ELECTRONIC COMPONENT

CROSS-REFERENCE TO RELATED APPLICATION

This application is based upon and claims the benefit of priority of the prior Japanese Patent Application No. 2018-210652, filed on Nov. 8, 2018, the entire contents of which are incorporated herein by reference.

FIELD

The embodiments discussed herein are related to an electronic component and a method of manufacturing an electronic component.

BACKGROUND

The demand for compact high-performance electronic devices such as smartphones and tablet PCs has been growing. With the demand for higher performance and more compact electronic devices, even higher density and higher functionality of circuit components have been sought and there has been a growing demand for circuit boards adapted to higher density and higher functionality of circuit components. Electronic components such as capacitors and inductors are mounted on circuit boards.

Component-embedded substrates have been proposed as a circuit board that is compact while being populated with more components. Component-embedded substrates are manufactured by arranging components inside a circuit board and then sequentially stacking an insulating layer and a conductor layer to form multilevel interconnections.

As a technique for such component-embedded substrates, there is a conventional technique that suppresses substrate warpage by heating a thermo-setting resin composition layer under a certain condition after stacking the thermosetting resin component layer on one side of an insulating substrate. There is another conventional technique that suppresses cracking by simultaneously hardening an upper interlayer insulating layer and a filling resin in a half-hardened state in the manufacturing process. The conventional techniques are disclosed in Japanese Laid-open Patent Publication No. 2015-135940 and Japanese Laid-open Patent Publication No. 2014-096446, for example.

Conventional component-embedded substrates are manufactured through the process including repeated resin lamination and copper plating from the first layer, and boring a hole by a laser after resin lamination and filling the bore with copper. With such a conventional manufacturing method, there are fewer metal parts such as copper, and the heat-dissipating efficiency is poor.

Even in the conventional technique that performs heat treatment after stacking a thermosetting resin composition layer on one surface of an insulating substrate and the conventional technique that simultaneously hardens an upper interlayer insulating layer and a filling resin in a half-hardened state, the volume of metal parts remains the same as conventional techniques, and it is difficult to improve the heat-dissipating efficiency.

SUMMARY

According to an aspect of an embodiment, an electronic component includes: a metal member having an outer lead, an inner lead disposed at a position opposed to the outer lead, and a metal pillar disposed between the outer lead and the inner lead and connecting the outer lead with the inner lead; a component disposed between the outer lead and the inner lead and connected to the outer lead or the inner lead; and a resin member encapsulating the metal member and the component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a schematic cross-sectional view of a lead frame according to a first embodiment;

DESCRIPTION OF EMBODIMENTS

Embodiments of an electronic component and a method of manufacturing an electronic component disclosed by the subject application will be described in detail below with reference to the drawings. It should be noted that the electronic component and the method of manufacturing an electronic component disclosed by the subject application are not limited by the embodiments below.

First Embodiment

Configuration of Lead Frame

Figure 2A:
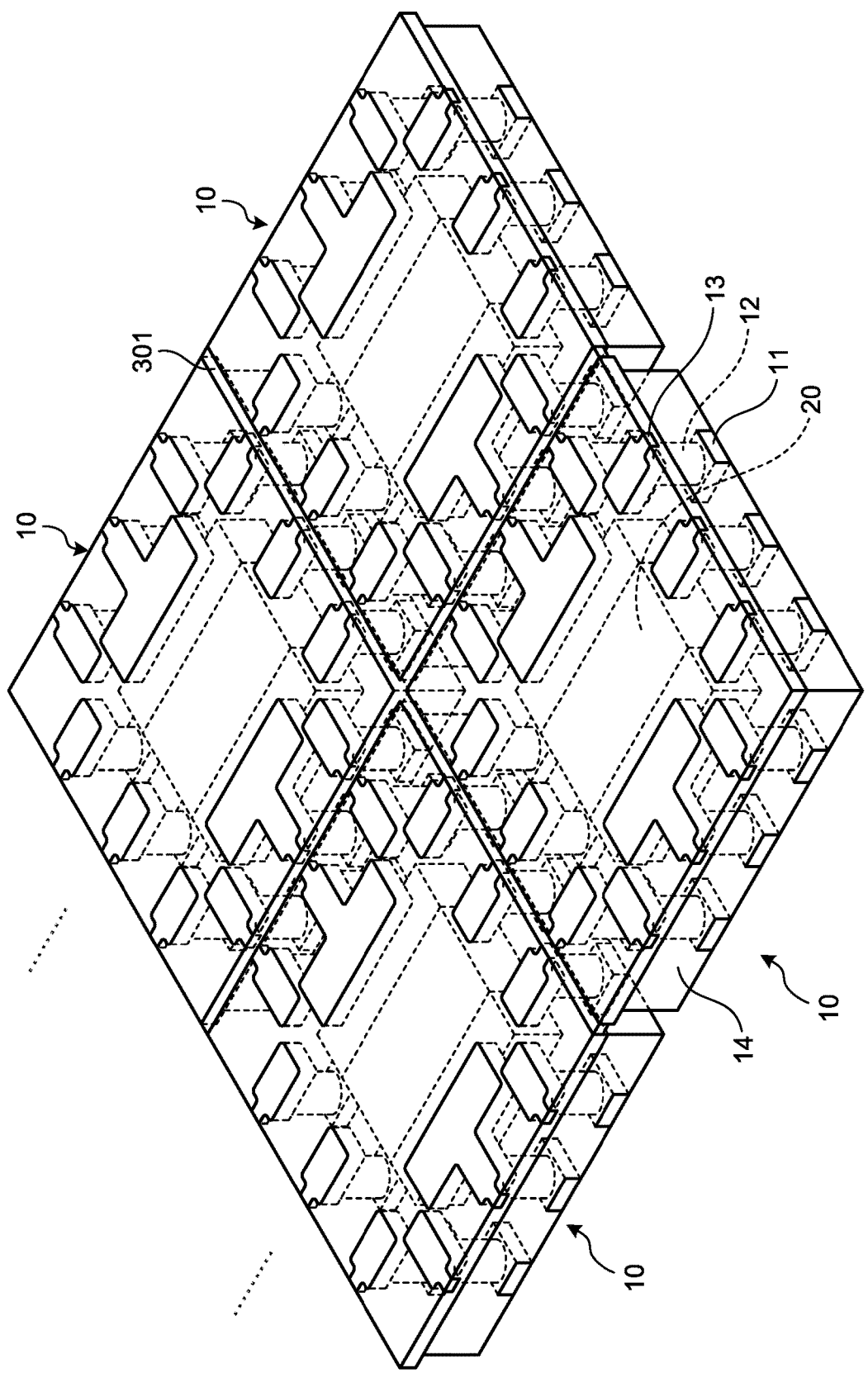
FIG. 2A is a perspective view of the front surface side of the lead frame according to the first embodiment.
Figure 2B:
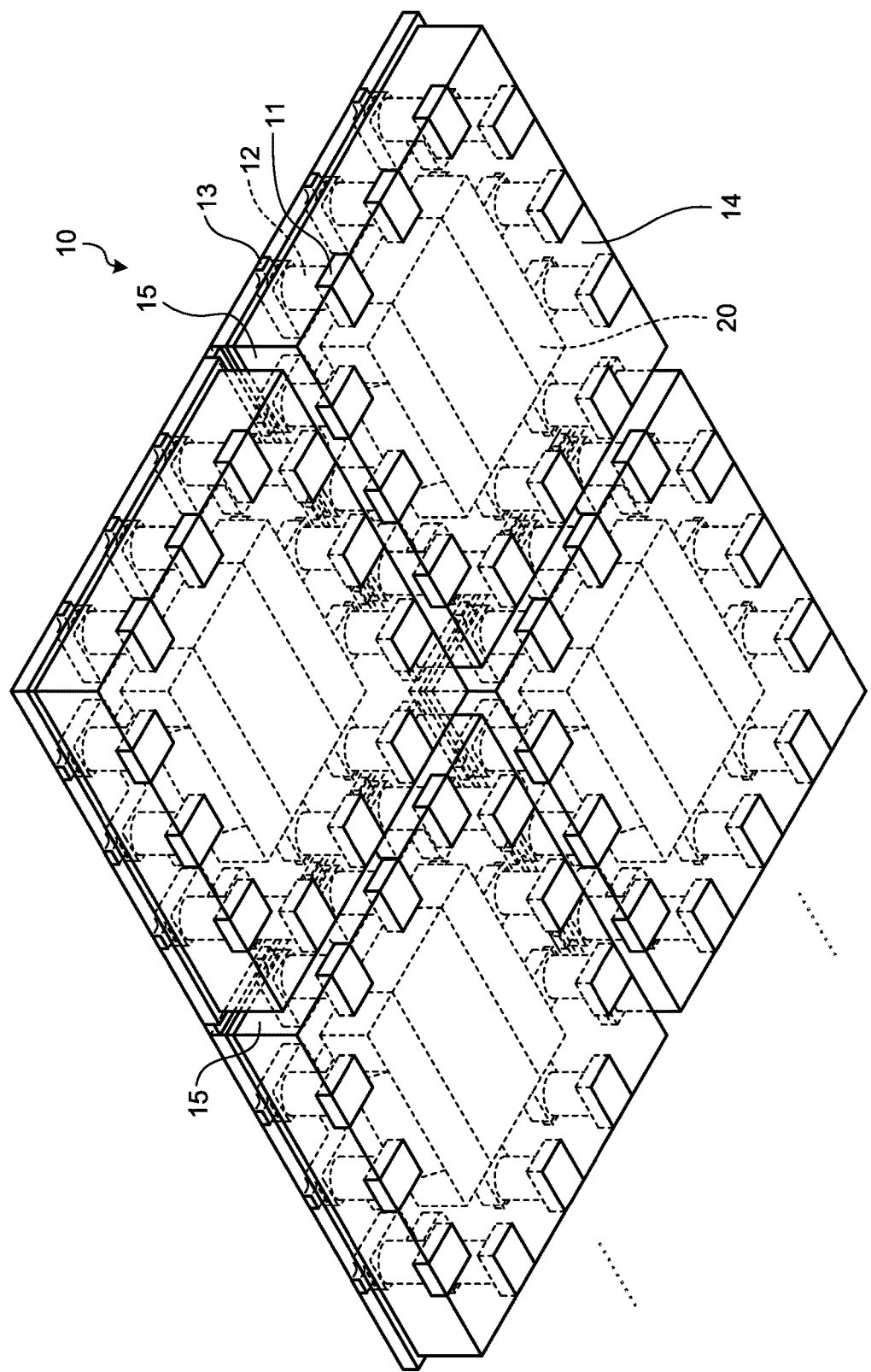
FIG. 2B is a perspective view of the back surface side of the lead frame according to the first embodiment.

FIG. 1 is a schematic cross-sectional view of a lead frame according to a first embodiment. In the following description, a surface on the upper side of the drawing sheet in FIG. 1 is referred to as the front surface, and a surface on the lower side of the drawing sheet is referred to as the back surface. FIG. 2A is a perspective view of the front surface side of the lead frame according to the first embodiment. FIG. 2B is a perspective view of the back surface side of the lead frame according to the first embodiment.

As illustrated in FIG. 1, a lead frame 1 includes a plurality of unit lead frames 10 arranged on a plane. This unit lead frame 10 corresponds to an example of "electronic component". More specifically, the lead frame 1 is configured such that individual unit lead frames 10 serving as electronic components are coupled to each other by a frame part 301. As an example, the lead frame 1 includes unit lead frames 10 arranged in a grid pattern. In the following description, for the sake of convenience, the unit lead frame 10 may be simply referred to as "lead frame 10".

In the lead frame 1, grooves 15 are provided on the outer lead 11 side between the unit lead frames 10. The lead frames 10 are coupled to each other by the frame part 301. The lead frame 10 has outer leads 11 included in an outer lead frame 100, posts 12, and inner leads 13 included in an inner lead frame 300. The lead frame 10 further has an inductor 20 and an encapsulating resin 14. Here, FIGS. 2A and 2B illustrate 2×2 unit lead frames 10 extracted from the lead frame 1 and do not illustrate the frame part 301 on the outer peripheral side of 2×2 unit lead frames 10.

The post 12 is a pillar-like member formed of a metal material such as copper (Cu) and copper alloy. For example, the material including copper provides favorable heat dissipation. However, the post 12 may be formed of a metal other than copper, such as iron-nickel alloy (Fe—Ni alloy). The post 12 according to the present embodiment is cylindrical. However, the post 12 may be shaped like a prism.

The outer lead 11 is connected to one end of the post 12. The inner lead 13 is bonded to the other end of the post 12. That is, the outer lead 11 and the inner lead 13 are connected through the post 12. The post 12 electrically connects the outer lead 11 with the inner lead 13. This post 12 corresponds to an example of "metal pillar" which is "one metal piece".

Plural sets of the outer lead 11, the post 12, and the inner lead 13 connected to each other are disposed in the lead frame 10. For example, in the present embodiment, as illustrated in FIGS. 2A and 2B, in total, 12 sets of the outer lead 11, the post 12, and the inner lead 13 connected to each other are disposed in one lead frame 10. More specifically, the connected outer lead 11, post 12, and inner lead 13 are disposed on the outer periphery of the lead frame 10. The height of the connected outer lead 11, post 12, and inner lead 13 may be about 0.6 to 1 mm. As used herein the height refers to the length from the surface on the front surface side of the inner lead 13 to the surface on the back surface side of the outer lead 11.

The outer lead 11 is an outer electrode in the lead frame 10. As the material of the outer lead 11, for example, copper (Cu), a Cu-based alloy, or an iron-nickel (Fe—Ni) or Fe—Ni-based alloy can be used. The thickness of the outer lead 11 is, for example, about 0.1 to 0.2 mm. As used herein the thickness of the outer lead 11 refers to the width in the direction toward the post 12.

The outer lead 11 is disposed on the back surface side of the lead frame 10. The outer lead 11 is ultimately connected to a circuit board. The outer lead 11 is exposed outside from the encapsulating resin 14, which is an insulator, and plated on the surface on the back surface side opposite to the post 12 and on the side surface on the groove 15 side. Since the outer lead 11 is plated even on the groove 15 side, the plating is wetted by solder to form a fillet when the outer lead 11 is soldered to a circuit board, thereby improving the mounting reliability.

The inner lead 13 is an inner electrode in the lead frame 10. As the material of the inner lead 13, for example, copper (Cu), a Cu-based alloy, or an iron-nickel (Fe—Ni) or Fe—Ni-based alloy can be used in the same manner as the outer lead 11. The thickness of the inner lead 13 may be, for example, about 0.1 to 0.2 mm.

The inner lead 13 is disposed on the front surface side of the lead frame 10. The inductor 20 is bonded to the inner lead 13 on the post 12 side. Specifically, in the present embodiment, there exist a pair of inner leads 13 each having a connection portion connected with the inductor 20 and other inner leads 13. A pair of inner leads 13 each having a connection portion connected with the inductor 20 are disposed at the positions opposed to each other and are connected to the inductor 20 on the surfaces on the post 12 side. A passive component such as resistor and capacitor or an active component such as converter integrated circuit (IC) is ultimately connected to the inner lead 13 on the surface on the front surface side opposite to the post 12.

Here, the inner lead 13 in the lead frame 1 is a part of a member formed by etching a thick copper plate, and the end of each inner lead 13 that extends toward the outside of the unit lead frame 10 is connected to one frame of the frame part having a plurality of frames.

The outer leads 11, the posts 12, the inner leads 13, and the inductor 20 in the bonded state are encapsulated by the encapsulating resin 14. Instead of the inductor 20, a passive component such as resistor and capacitor or an active component such as integrated circuit (IC) may be encapsulated by the encapsulating resin 14. In addition, a thermosetting resin such as epoxy resin can be used as the encapsulating resin 14.

A magnetic material-containing resin may be used as the encapsulating resin 14. Examples of the magnetic material include a material produced by subjecting an Fe-based amorphous alloy to outer periphery insulating treatment, a material produced by subjecting carbonyl iron powder to outer periphery insulating treatment, and ferrite powder. The magnetic material-containing resin is produced by blending a thermosetting resin such as epoxy resin as a binder with a magnetic material. The ratio of the magnetic material and the binder is preferably adjusted by insulating properties, permeability, and a production method. Here, a material having insulating properties is used as the binder. Alternatively, when the magnetic material in the magnetic material-containing resin is conducive to some extent, an insulating resin coating is provided on the surfaces of the outer lead 11, the post 12, and the inner lead 13 to insulate them from the magnetic material-containing resin. The use of the magnetic material-containing resin as the encapsulating resin 14 improves the inductance value. This encapsulating resin 14 corresponds to an example of "resin member".

Configuration of Component-Embedded Substrate

Figure 3A:
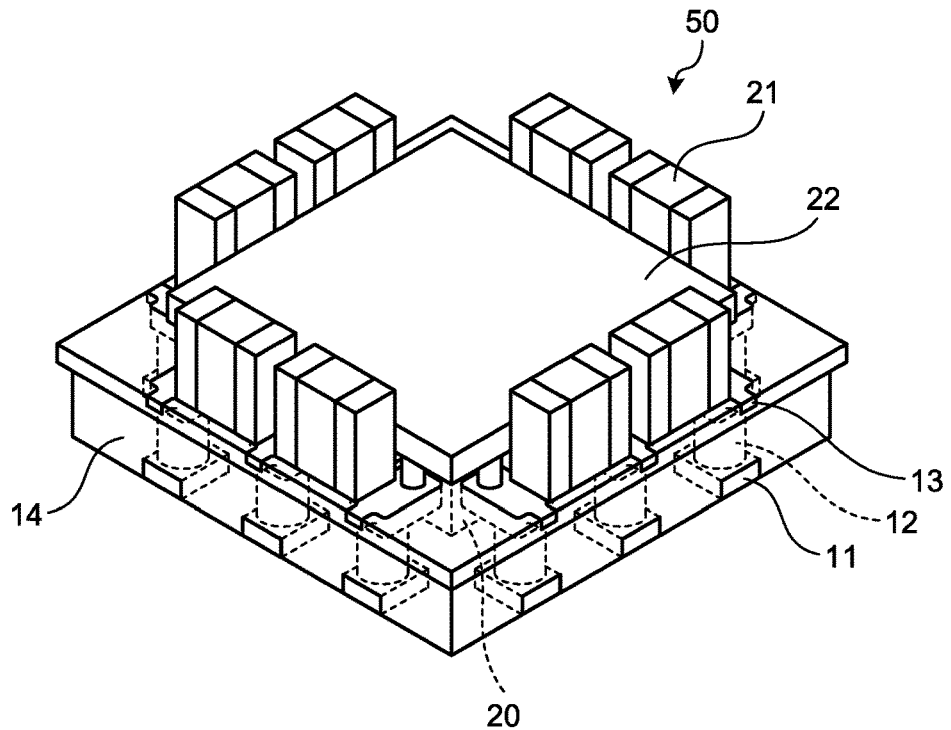
FIG. 3A is a perspective view of the front surface side of a component-embedded substrate according to the first embodiment.
Figure 3B:
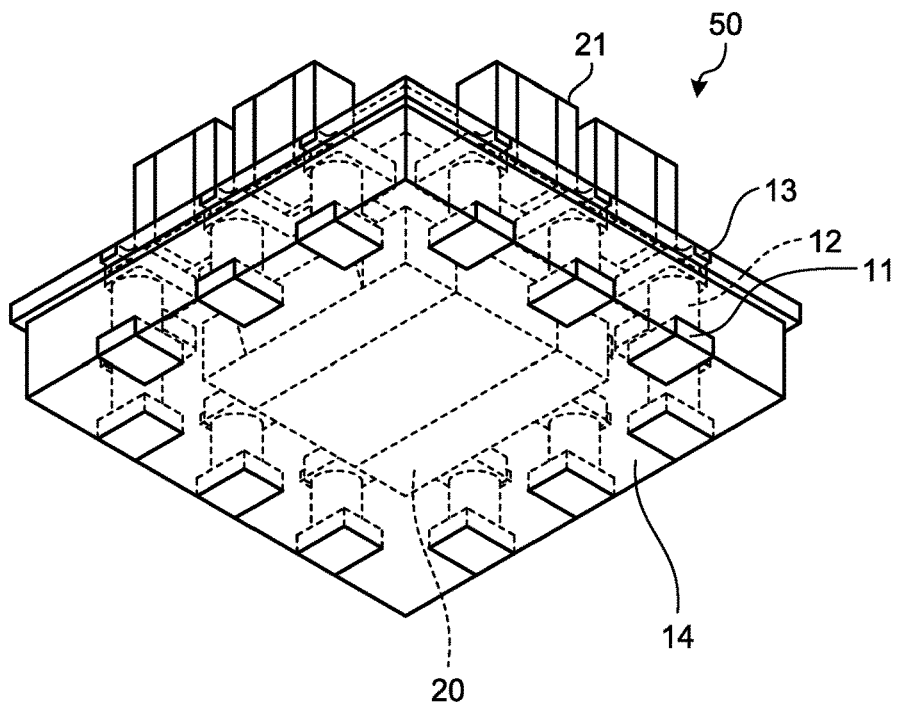
FIG. 3B is a perspective view of the back surface side of the component-embedded substrate according to the first embodiment.
Figure 4:
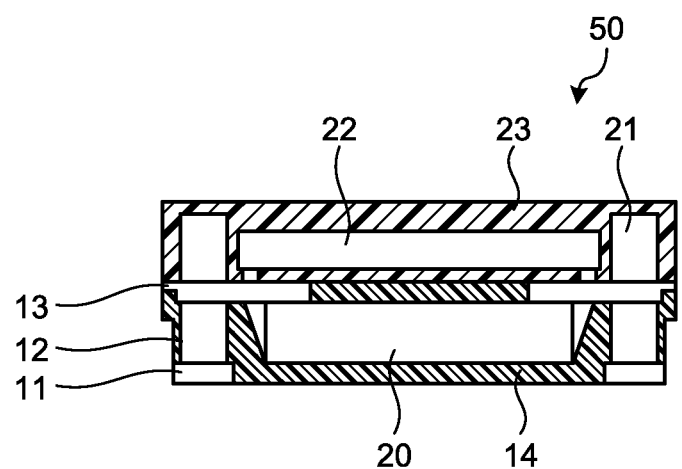
FIG. 4 is a schematic cross-sectional view of the component-embedded substrate according to the first embodiment.

FIG. 3A is a perspective view of the front surface side of a component-embedded substrate according to the first embodiment. FIG. 3B is a perspective view of the back surface side of the component-embedded substrate according to the first embodiment. FIG. 4 is a schematic cross-sectional view of the component-embedded substrate according to the first embodiment. In FIGS. 3A and 3B, for easy understanding of the structure, encapsulating resin 23 in FIG. 4 is not illustrated.

A component-embedded substrate 50 is produced by mounting electronic components on the lead frame 1 and dividing the lead frame 1 into small pieces of individual unit lead frames 10. At this point of time, the inner leads 13 are cut from the frame of the frame part. In the component-embedded substrate 50 according to the present embodiment, a passive component 21 such as resistor and capacitor and an active component such as a converter IC 22 are mounted as components on the exposed surface of the inner lead 13 from the encapsulating resin 14. As illustrated in FIG. 4, the passive component 21 and the converter IC 22 bonded to the lead frame 10 are encapsulated by a encapsulating resin 23. For example, a thermosetting resin such as epoxy resin can be used as the encapsulating resin 23. This component-embedded substrate 50 corresponds to an example of "electronic component".

Method of Manufacturing Lead Frame

Figure 5A:
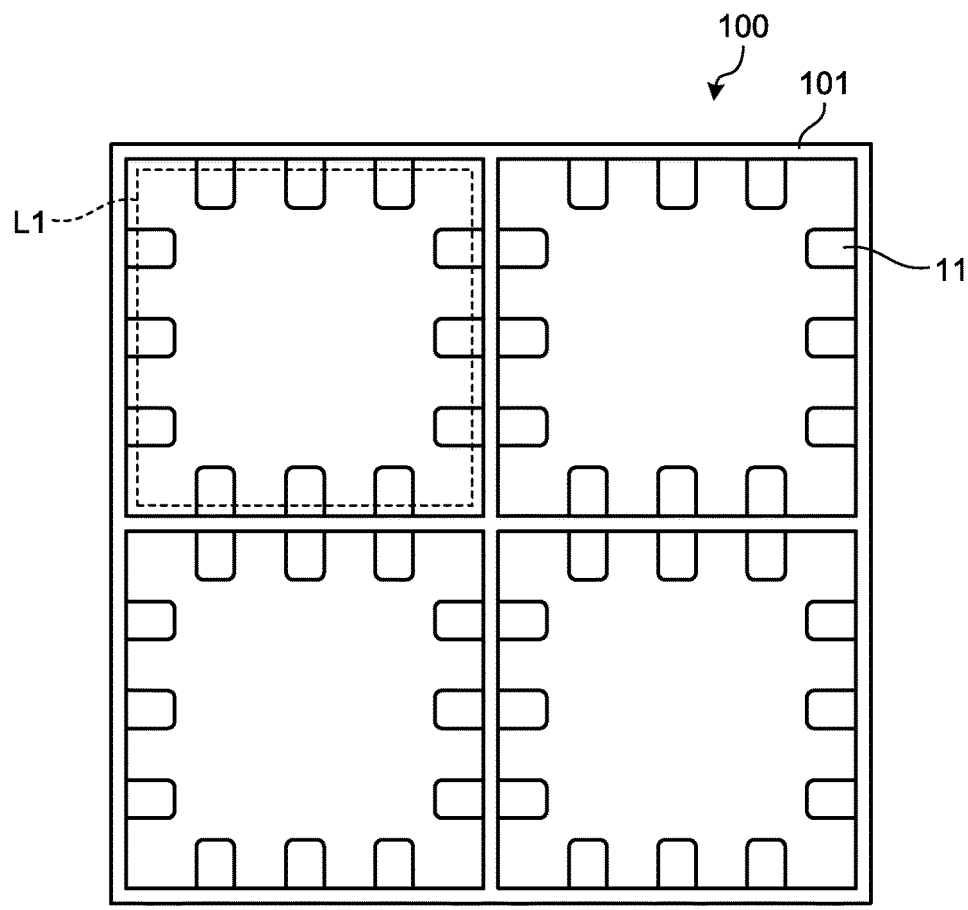
FIG. 5A is a plan view of an outer lead frame.
Figure 5B:
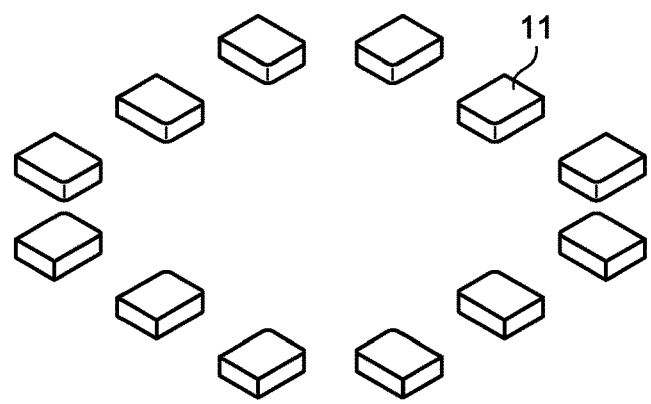
FIG. 5B is a perspective view of outer leads.
Figure 6A:
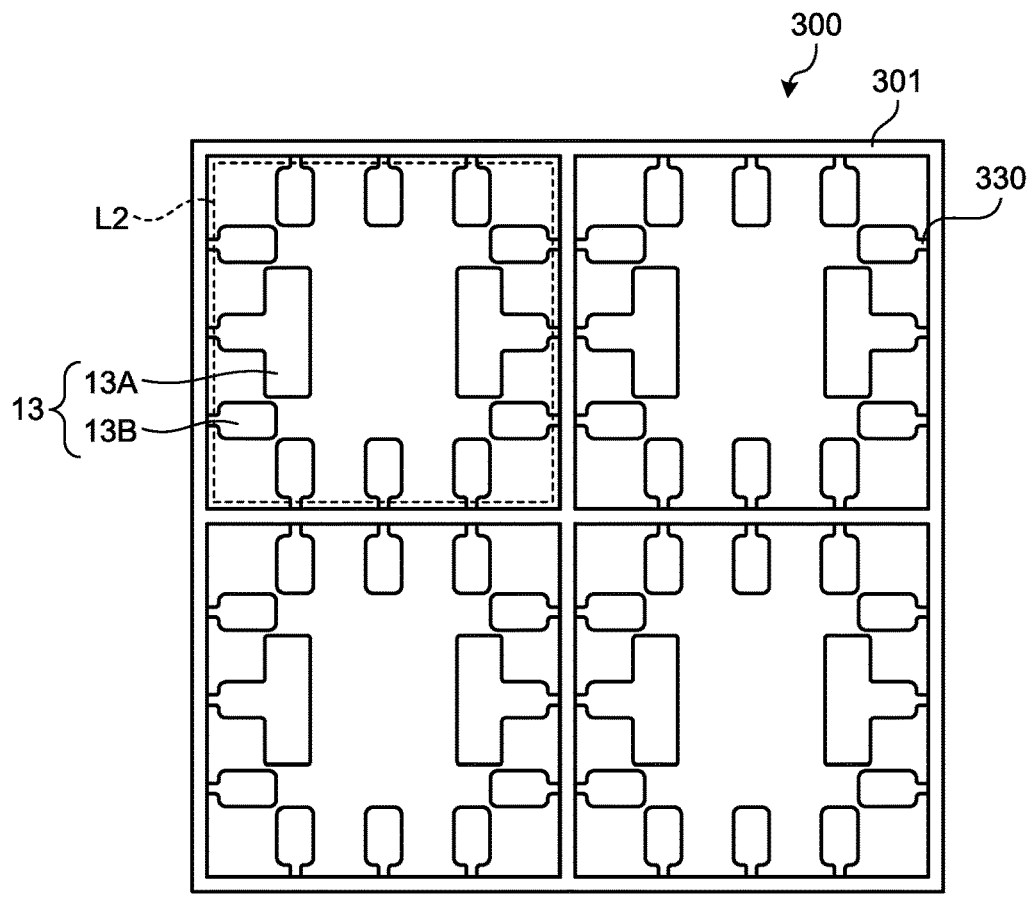
FIG. 6A is a plan view of an inner lead frame.
Figure 6B:
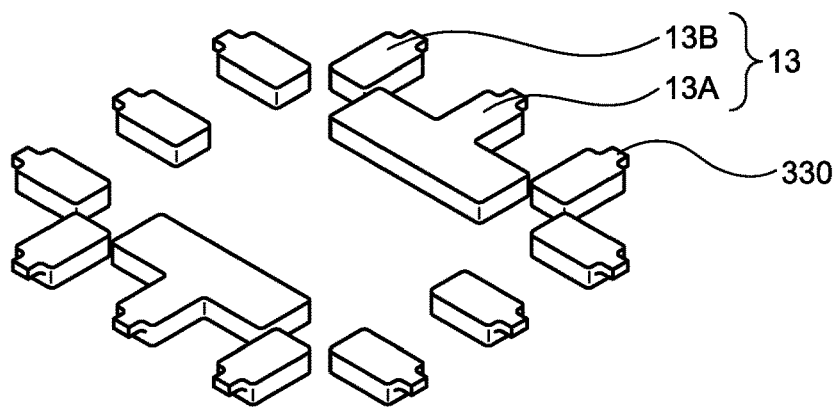
FIG. 6B is a perspective view of inner leads.

First of all, the outer lead frame 100 illustrated in FIG. 5A and an inner lead frame 200 illustrated in FIG. 6A are prepared. FIG. 5A is a plan view of the outer lead frame. FIG. 5B is a perspective view of the outer leads. FIG. 6A is a plan view of the inner lead frame. FIG. 6B is a perspective view of the inner leads.

As illustrated in FIG. 5A, the outer lead frame 100 is a lead frame in which the outer leads 11 are connected to a frame part 101. The outer lead frame 100 is a first-layer substrate in the lead frame 1 and formed by etching or blanking a thick copper plate. As illustrated in FIG. 5B, a plurality of outer leads 11 are produced by cutting the outer lead frame 100 at a cut line L1. In this stage in the manufacturing process of the lead frame 1, the outer lead frame 100 is not yet cut.

As illustrated in FIG. 6A, the inner lead frame 300 is a lead frame in which the inner leads 13 are connected to the frame part 301. The inner lead frame 300 is formed by etching a thick copper plate and half-etching a part thereof. In the present embodiment, the inner leads 13 include an inner lead 13A having a connection portion connected to the inductor 20 and an inner lead 13B other than the inner lead 13A. Hereinafter, the inner lead 13A and the inner lead 13B are called inner lead 13 unless distinguished otherwise. As illustrated in FIG. 6B, a plurality of inner leads 13 are produced by cutting the inner lead frame 300 at a cut line L2. In this stage in the manufacturing process of the lead frame 1, the inner lead frame 300 is not yet cut.

Figure 7:
FIG. 7 is a side view of the inner lead.

Here, in the inner lead frame 300, as illustrated in FIG. 7, the inner lead 13 has a thin plate portion 330 with a thickness reduced on the side connected to the frame part 301 by half-etching and with a width smaller than the other portion of the inner lead 13. FIG. 7 is a side view of the inner lead.

The inner lead frame 300 is ultimately cut when the component-embedded substrate 50 is produced, and the cut surface is exposed on the outside of the encapsulating resin 14. In the present embodiment, the cut line L2 in FIG. 6A is located at the thin plate portion 330. In the present embodiment, therefore, the cut surface of the inner lead 13 can be reduced compared with a copper plate having no thin plate portion 330. Here, if copper that forms the inner lead 13 is exposed outside, rust is formed to deteriorate the electrical characteristics of the inner lead 13. In the inner lead 13 according to the present embodiment, the area of copper exposed outside is reduced, whereby deterioration of the electrical characteristics can be alleviated.

Figure 8:
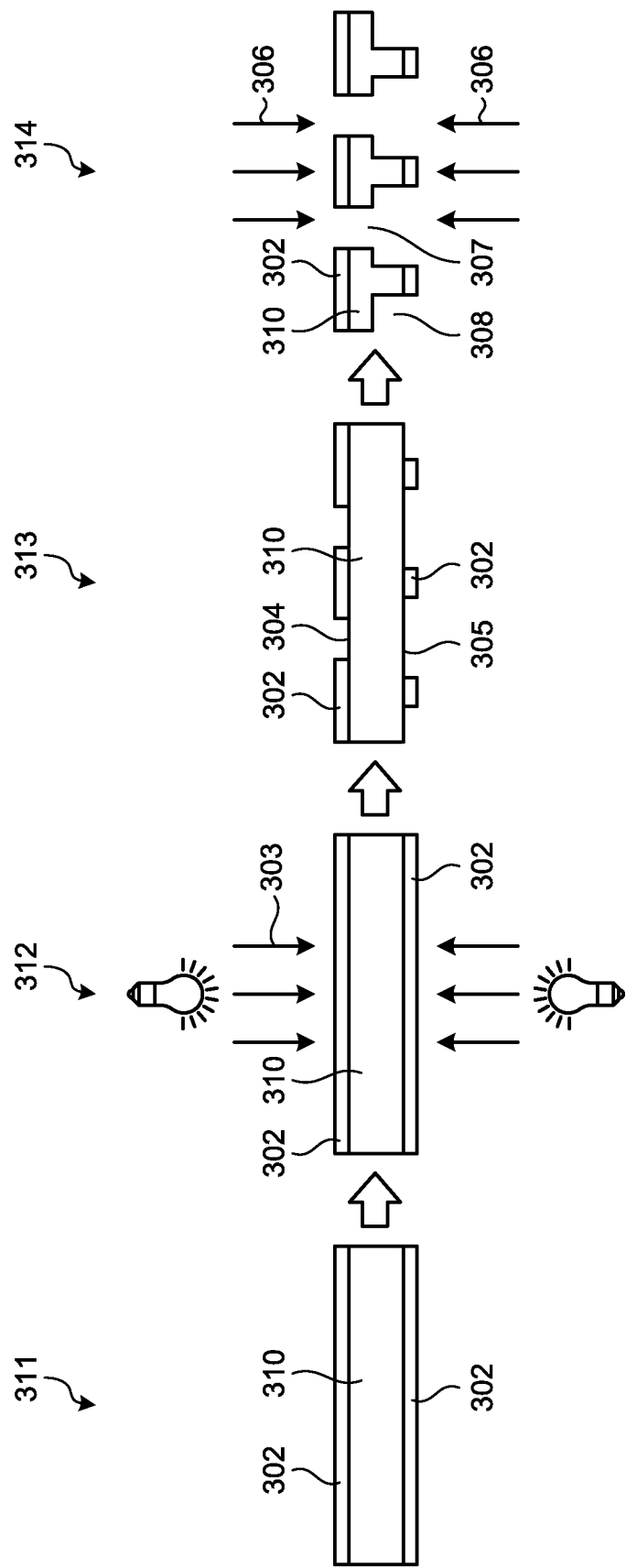
FIG. 8 is a diagram illustrating production of a substrate by etching.

Production of a lead frame by etching will now be described. FIG. 8 is a diagram illustrating production of a lead frame by etching. Etching proceeds from states 311 to 314 in order.

A thick copper plate 310 shaped like a flat plate is prepared. Resist 302 is then applied on each of the entire front surface and the entire back surface of the thick copper plate 310 and dried into state 311. Next, a photomask having a desired pattern is arranged on the resist 302 as illustrated in state 312 and irradiated with light 303 to expose the resist 302 as illustrated in state 312. Next, the exposed resist 302 is developed to form the resist 302 having a desired opening. Specifically, as illustrated in state 313, an opening 304 is formed at a portion where through-etching is performed on the front surface side of the thick copper plate 310. An opening 305 is formed at a portion where half-etching and etching is performed on the back surface side of the thick copper plate 310. Next, using the resist 302 as a mask, the thick copper plate 310 is etched by etchant 306 to produce a base material. As illustrated in state 314, the portion where etchant 306 is supplied from both of the front surface and the back surface serves as a through hole 307. The portion where etchant 306 is not supplied from the front surface side is half-etched from the back surface to form a thin plate portion 308. The resist 302 is thereafter removed. The inner lead frame 300 is formed by the method described above.

Next, the outer lead 11 of the outer lead frame 100, the post 12, and the inner lead 13 of the inner lead frame 300 are bonded. As a bonding method, for example, diffusion bonding or bonding using solder or metal paste can be used.

Figure 9:
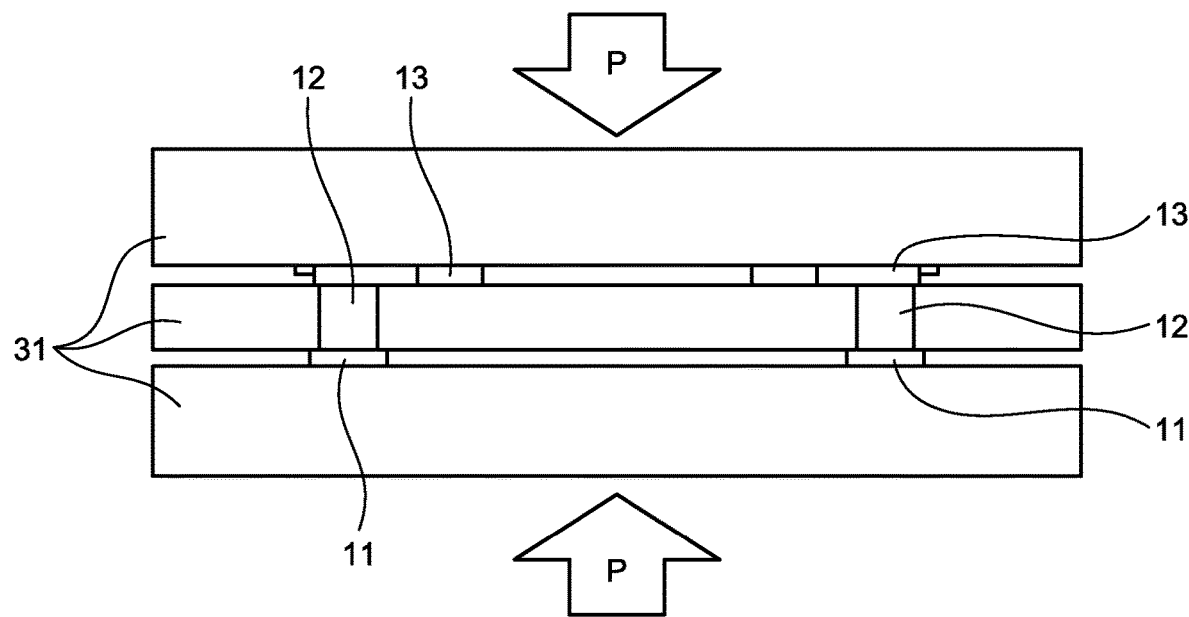
FIG. 9 is a diagram illustrating diffusion bonding.

Referring to FIG. 9, the detail of diffusion bonding is described. FIG. 9 is a diagram illustrating diffusion bonding. The outer lead frame 100 is arranged on a flat plate-shaped carbon jig 31. Next, a flat plate-shaped carbon jig 31 having through holes in which the posts 12 are accommodated is arranged on the outer lead frame 100. The inner lead frame 300 is further arranged on the carbon jig 31 in which the posts 12 are accommodated. Next, a flat plate-shaped carbon jig 31 is arranged on the inner lead frame 300. The members arranged as described above are placed in vacuum. The carbon jigs 31 on the outside are subjected to pressure P in the stacking direction of the carbon jigs 31 and heated, and the atoms in the outer lead 11, the post 12, and the inner lead 13 inter-diffuse whereby they are bonded to each other. In the case of the lead frame 1 according to the present embodiment, for example, diffusion bonding can be performed in a vacuum of 10 Pa or lower, with a pressure P of 0.005 kN/mm$^2$, and with a temperature of 600° C. kept for five minutes.

Figure 10:
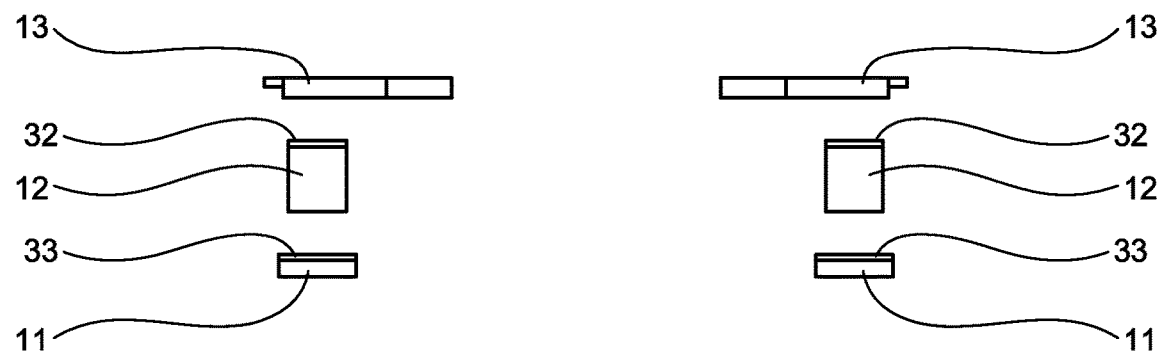
FIG. 10 is a diagram illustrating bonding by solder or metal paste.

FIG. 10 is a diagram illustrating bonding by solder or metal paste. In bonding by solder or metal paste, solder or metal paste is arranged at the bonding portion between the outer lead 11 and the post 12 and the bonding portion between the inner lead 13 and the post 12. Metal such as copper (Cu) or silver (Ag) can be used as the metal paste. In the present embodiment, solder 32 is applied on the bonded surface of the post 12 with the inner lead 13, and solder 33 is applied on the bonded surface of the outer lead 11 with the post 12. The outer lead 11, the post 12, and the inner lead 13 with the solder 32 and 33 applied thereon are stacked and then bonded by melting the solder 32 and 33, for example, by heating and then hardening the solder 32 and 33 by cooling.

The diffusion bonding illustrated in FIG. 9 can improve the connection reliability and alleviate electric resistance, because the members formed of copper are directly bonded to each other. The diffusion boding therefore can produce a high-quality substrate. By contrast, the bonding using solder or metal paste can be readily performed and can save cost compared with the diffusion bonding. In the present embodiment, the bonding between the outer lead 11, the post 12, and the inner lead 13 is performed by diffusion bonding.

Figure 11A:
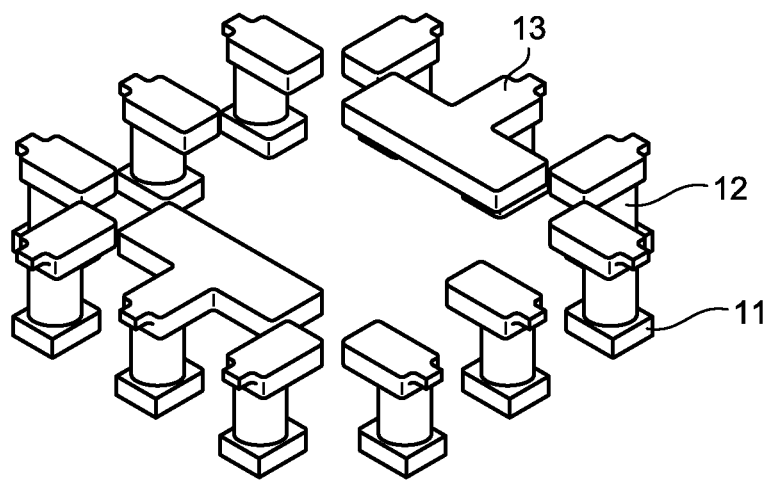
FIG. 11A is a perspective view of the front surface side of a metal substrate.
Figure 11B:
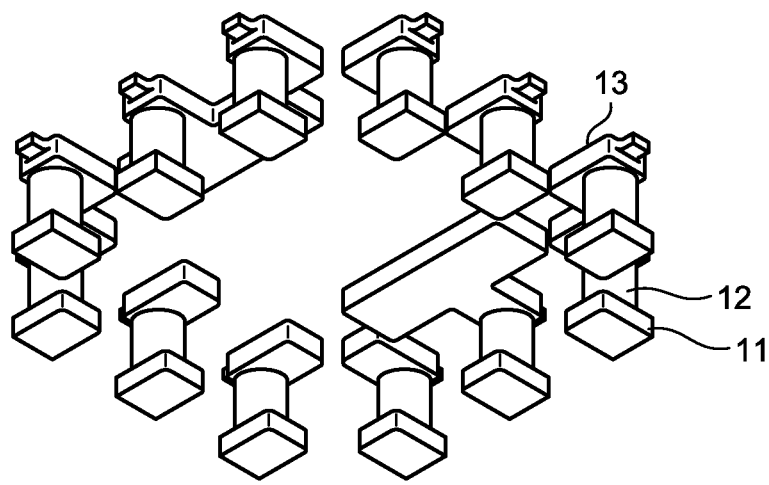
FIG. 11B is a perspective view of the back surface side of the metal substrate.

This bonding process forms a metal substrate illustrated in FIGS. 11A and 11B in which the outer lead 11, the post 12, and the inner lead 13 are bonded together. FIG. 11A is a perspective view of the front surface side of the metal substrate. FIG. 11B is a perspective view of the back surface side of the metal substrate. As illustrated in FIG. 11A and FIG. 11B, through the bonding, the outer lead 11, the post 12, and the inner lead 13 are arranged in the integrated state. Here, in FIGS. 11A and 11B, the outer leads 11, the posts 12, and the inner leads 13 corresponding to the unit lead frame 10 are illustrated for the sake of clarity. However, the state in this stage is actually the state in which the outer leads 11 included in the outer lead frame 100 illustrated in FIG. 5A are individually connected to the inner lead 13 included in the inner lead frame 300 illustrated in FIG. 6A through the posts 12.

Figure 12:
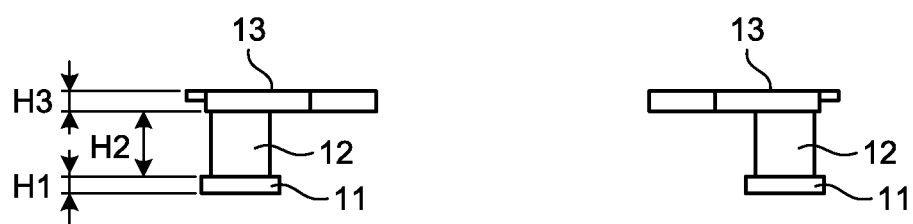
FIG. 12 is a side view of the metal substrate.

Referring now to FIG. 12, the heights of the outer lead 11, the post 12, and the inner lead 13 in the bonded state are described. As used herein the height refers to the width of each member in the direction from the outer lead 11 to the inner lead 13. FIG. 12 is a side view of the metal substrate. As illustrated in FIG. 12, the height H1 of the outer lead 11 is about 0.1 to 0.2 mm. The height H2 of the post 12 is about 0.2 to 0.6 mm. The height H3 of the inner lead 13 is about 0.1 to 0.2 mm.

Figure 13:
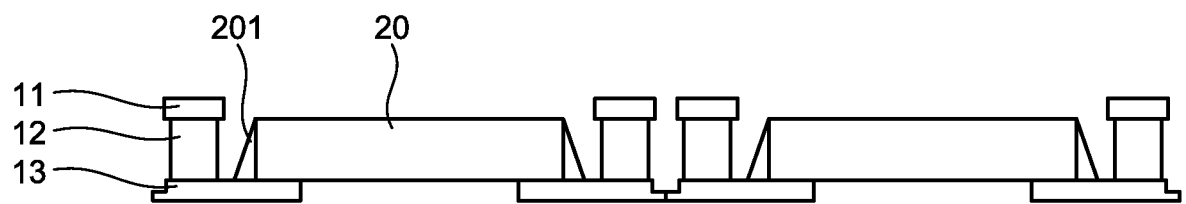
FIG. 13 is a diagram illustrating a state in which an inductor is mounted.

Next, for the outer lead 11, the post 12, and the inner lead 13 in the bonded state, the inductor 20 is mounted on the surface of the inner lead 13A in FIGS. 6A and 6B on the outer lead 11 side, for example, using an electronic component mounter. The inductor 20 is, for example, shaped like a rectangular parallelepiped and has electrodes on a pair of ends opposed to each other. The electrode is connected to the inner lead 13A by solder. For example, as illustrated in FIG. 13, the outer lead 11, the post 12, and the inner lead 13 in the bonded state are turned upside down, the inductor 20 is installed on the surface of the inner lead 13A on the outer lead 11 side, and the inner lead 13A and the inductor 20 are soldered using solder 201. FIG. 13 is a diagram illustrating the state in which the inductor 20 is mounted.

Figure 14:
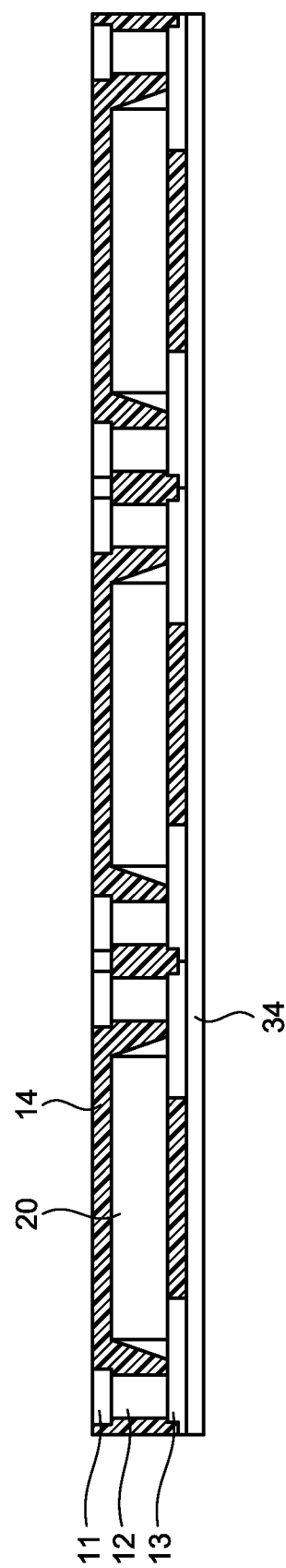
FIG. 14 is a diagram illustrating a encapsulated state.

Next, the metal substrate with the inductor 20 mounted thereon is molded with resin, and the outer leads 11, the posts 12, the inner leads 13, and the inductor 20 are encapsulated with the encapsulating resin 14 as illustrated in FIG. 14. FIG. 14 is a diagram illustrating the encapsulated state.

For example, tape 34 for encapsulation is affixed to the inner lead 13 side of the metal substrate with the inductor 20 mounted thereon, which is then put into a transfer molding device. Resin molding is performed by injecting the encapsulating resin 14. This method is called transfer press molding. An inorganic filler-containing epoxy resin which is a thermosetting resin is preferably used as the encapsulating resin 14. After encapsulating with resin, the tape 34 for encapsulation is removed.

A magnetic material-containing resin as previously mentioned may be used as the encapsulating resin 14. The use of a magnetic material-containing resin as the encapsulating resin 14 improves the inductance value of the inductor 20. The magnetic material-containing resin is produced by blending a magnetic material with a thermosetting resin such as an inorganic filler-containing epoxy resin as a binder.

Figure 15:
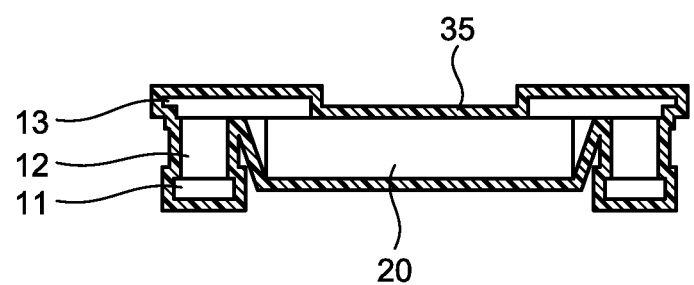
FIG. 15 is a diagram illustrating a state in which an insulating resin coating is formed.

Here, when the magnetic material in the magnetic material-containing resin is conductive to some extent, it is preferable that an insulating resin is applied to the entire metal substrate with the inductor 20 mounted thereon to form an insulating resin coating 35 as illustrated in FIG. 15 before encapsulating. FIG. 15 is a diagram illustrating a state in which the insulating resin coating is formed. Specifically, the insulating resin coating 35 is evenly formed on the entire metal substrate with the inductor 20 mounted thereon, for example, by electrodeposition. For example, an epoxy resin or a polyimide resin can be used as the insulating resin. The film thickness of the insulating resin coating 35 is preferably around 10 μm.

Figure 16:
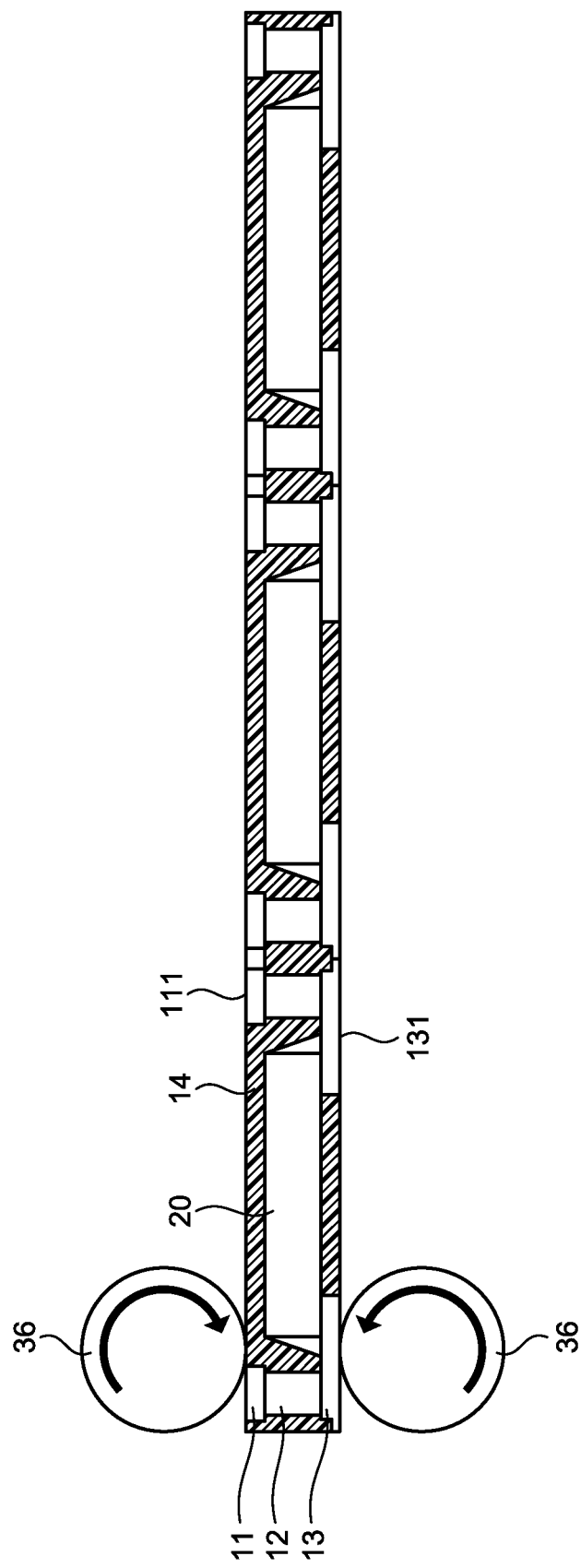
FIG. 16 is a diagram illustrating double-sided polishing.

Next, as illustrated in FIG. 16, the metal substrate with the inductor 20 mounted thereon and encapsulated with the encapsulating resin 14 is subjected to double-sided polishing using buffing rollers 36 of a polisher to expose the electrode surfaces of the outer leads 11 and the inner leads 13 on the outside of the encapsulating resin 14. FIG. 16 is a diagram illustrating double-sided polishing. Specifically, the metal substrate with the inductor 20 mounted thereon and encapsulated with the encapsulating resin 14 is subjected to buff polishing and blasting, and the residues of the encapsulating resin 14 produced by polishing on the electrode surfaces of the outer leads 11 and the inner leads 13 are removed, whereby the electrode surfaces are exposed outside.

Figure 17:
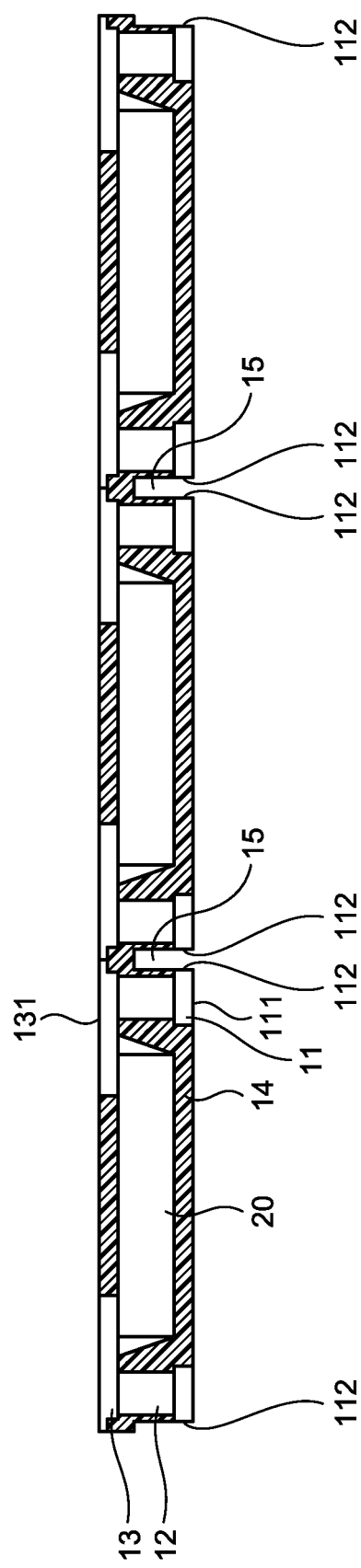
FIG. 17 is a diagram illustrating a state in which grooving is performed.

Next, as illustrated in FIG. 17, grooves 15 are provided on the outer electrode side of the metal substrate with the inductor 20 mounted thereon and encapsulated with the encapsulating resin 14. FIG. 17 is a diagram illustrating a state in which grooving is performed. For example, the groove 15 is formed by performing grooving, for example, using a dicer on the encapsulating resin 14 from the outer electrode surface on the back surface side exposing the outer leads 11 up to the halfway of the post 12 in the direction in which the points of connection between the outer lead 11 and the frame part 101 are aligned in a row. The outer lead 11 is then cut off from the frame part 101 of the outer lead frame 100. A side surface 112, which has been connected to the frame part 101 of the outer lead 11, is then exposed on the outside of the encapsulating resin 14.

Figure 18:
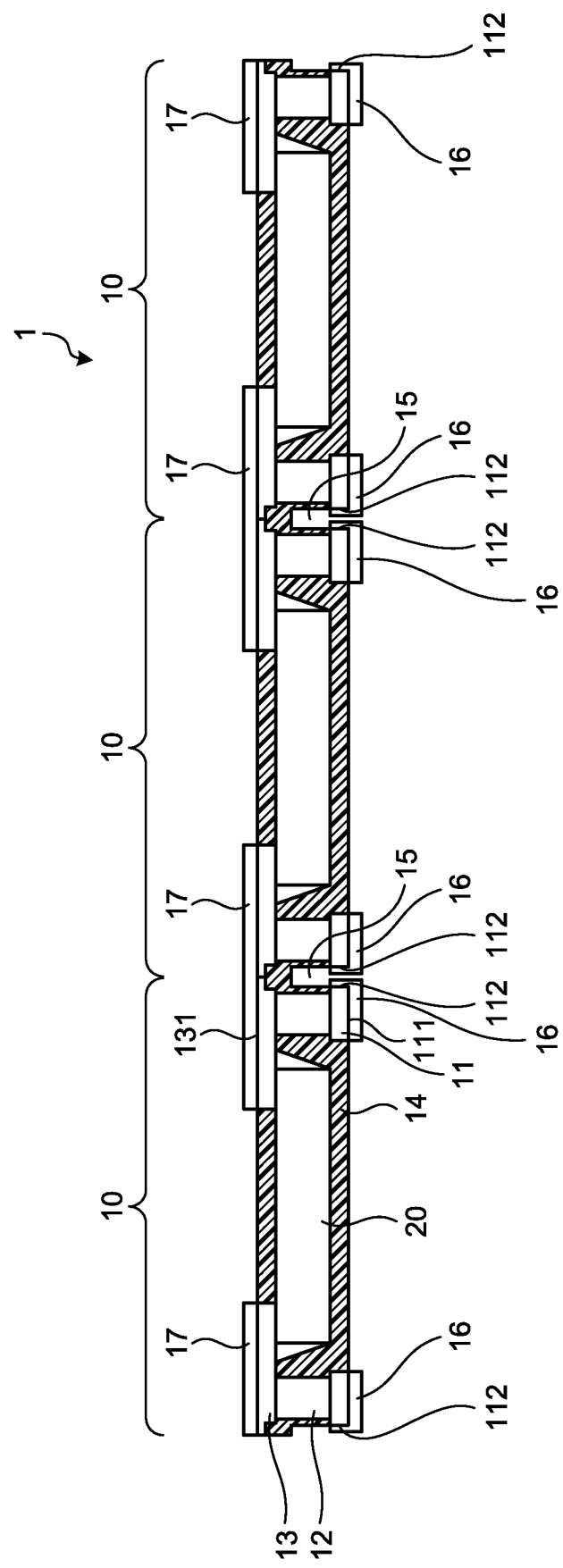
FIG. 18 is a diagram illustrating a state in which electrodes are plated.

Next, as illustrated in FIG. 18, an electrode surface 111 of the outer lead 11 that is exposed outside and an electrode surface 131 of the inner lead 13 that is exposed outside are subjected to electroplating. FIG. 18 is a diagram illustrating a state in which the electrodes are plated. For example, Ni/Pd/Au, Ni/Au, Ni/Ag, or Ni/Sn can be used as a material composition of plating 16. Specifically, the plating 16 is produced by depositing a Ni layer, a Pd layer, and a Au layer, depositing a Ni layer and a Au layer, depositing a Ni layer and a Ag layer, or depositing a Ni layer and a Sn layer in order from the electrode surface 111 and the electrode surface 131.

In this case, power is fed to the inner lead frame 300 connected with the inner leads 13, whereby the plating 16 is applied to the electrode surface 111 of the outer lead 11 and the plating 17 is applied to the electrode surface 131 of the inner lead 13. Furthermore, when the electrode surface 111 is plated, the plating 16 is also applied to the side surface 112 exposed on the outside of the outer lead 11. In this way, since power is fed to all of the inner leads 13 and the outer leads 11 by feeding power to the inner lead frame 300, the inner leads 13 are not to be cut off from the frame part 301 of the inner lead frame 300 up to this step. Through the manufacturing process described above, the lead frame 1 illustrated in FIGS. 1, 2A, and 2B is produced. In FIGS. 1, 2A, and 2B, the plating 16 and 17 are not illustrated.

Method of Manufacturing Component-Embedded

Substrate

Figure 19:
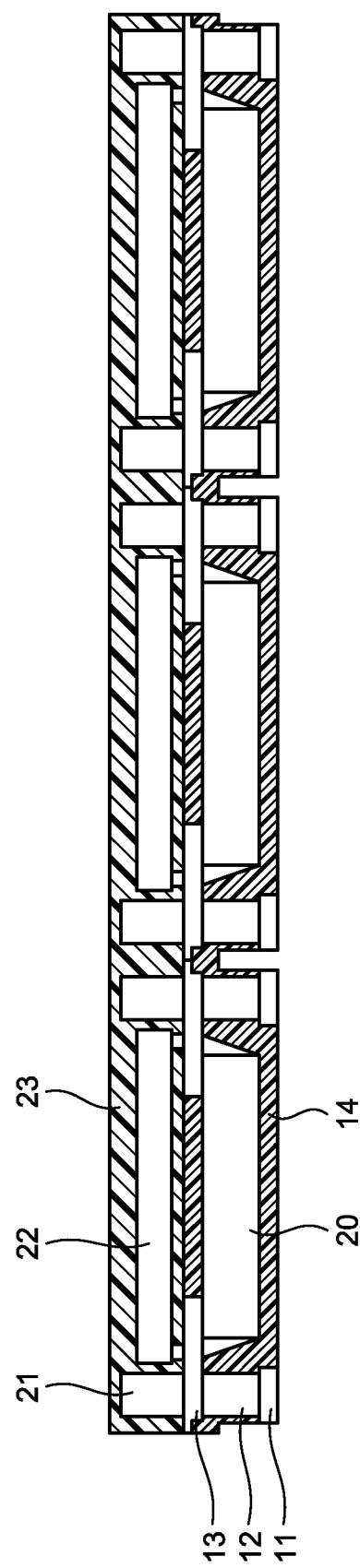
FIG. 19 is a diagram illustrating a state in which electronic components are mounted.

A method of manufacturing the component-embedded substrate 50 using the lead frame 1 produced by the manufacturing method above is described. FIG. 19 is a diagram illustrating a state in which electronic components are mounted.

In the present embodiment, as illustrated in FIG. 19, the passive component 21 and the converter IC 22 are installed on the electrode surface exposed from the encapsulating resin 14 on the front surface side of the inner lead 13 of the lead frame 1 in the state in FIG. 18 through the manufacturing process above. For example, the passive component 21 such as resistor or capacitor is a rectangular parallelepiped and has electrodes on a pair of ends opposed to each other. The electrode is connected to the inner lead 13 by solder. For example, an active component such as the converter IC 22 is shaped like a flat plate and has a circuit formation surface on which a solder bump is formed as an electrode. The solder bump connects the active component such as the converter IC 22 to the inner lead 13.

The passive component 21 and the converter IC 22 installed on the lead frame 1 are molded with the encapsulating resin 23, so that the encapsulating resin 23 encapsulates the passive component 21 and the converter IC 22. An inorganic filler-containing resin is preferably used for the encapsulating resin 23. This process results in a state in which the passive component 21 and the converter IC 22 are mounted on the lead frame 1 as illustrated in FIG. 19.

Next, the lead frame 1 having the passive component 21 and the converter IC 22 mounted thereon is cut into small pieces, whereby a module of the component-embedded substrate 50 illustrated in FIGS. 3A, 3B, and 4 including the unit lead frame 10 is completed. The dividing into small pieces is performed by cutting the encapsulating resin 14, the frame part 301, and the encapsulating resin 23 at the cut line L2 of the inner lead frame 300 in FIG. 6A.

Figure 20:
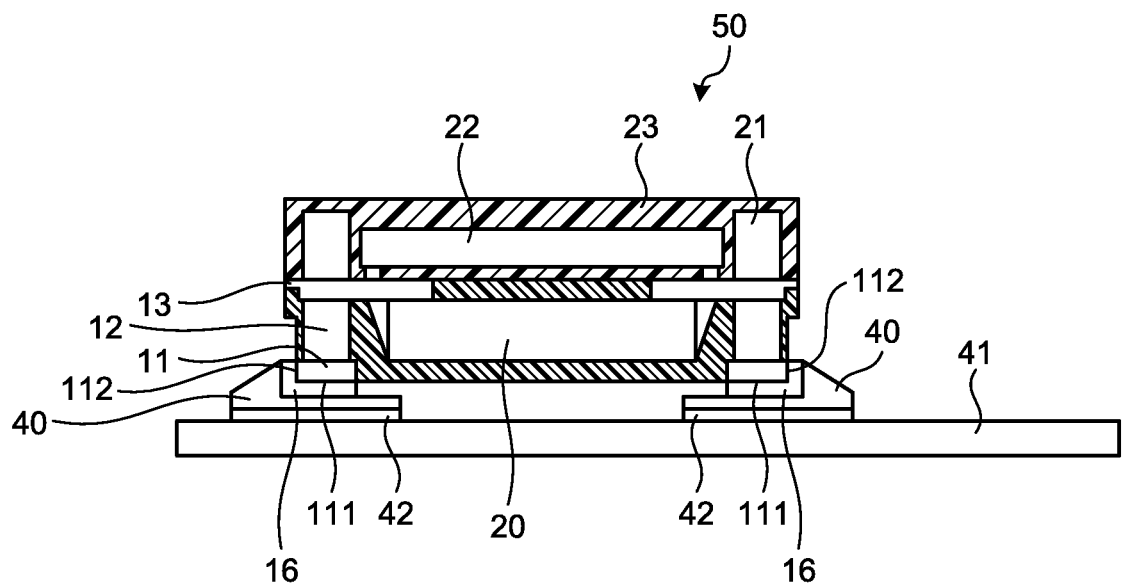
FIG. 20 is a diagram illustrating a state in which the component-embedded substrate is bonded to a circuit board.

Referring now to FIG. 20, a state in which the component-embedded substrate 50 is bonded to a circuit board 41 is described. FIG. 20 is a diagram illustrating a state in which the component-embedded substrate is bonded to a circuit board. The component-embedded substrate 50 is bonded to the circuit board 41 and used as a circuit component.

The component-embedded substrate 50 is mounted on the circuit board 41 by bonding the outer leads 11 with the plating 16 to the circuit board 41. In a specific bonding method, for example, the outer leads 11 with the plating 16 are soldered to electrodes 42 of the circuit board 41. Here, as described above, the electrode surface 111 as well as the side surface 112 of the outer lead 11 is coated with the plating 16. In this case, the solder wets and spreads to the plated portion of the electrode surface 111 and to the plated portion of the side surface 112. The soldering thus forms a fillet 40 between the side surface 112 and the electrode 42 of the circuit board 41. This increases the bonding strength and improves the mounting reliability of the component-embedded substrate 50.

As explained above, the lead frame according to the present embodiment is manufactured by bonding the outer lead, the post, and the inner lead and connecting an inductor to the inner lead, followed by encapsulating with resin. By contrast, the conventional resin multilayer laminated substrate is manufactured by forming resin laminates and copper plating in multiple layers. More specifically, the manufacturing process of the lead frame according to the present embodiment is simplified compared with the conventional resin multilayer laminated substrate, and the component-embedded substrate can be manufactured with low cost. Specifically, the manufacturing process can be simplified by forming the post in one metal piece. In addition, the use of the lead frame enables manufacturing of a large number of component-embedded substrates in one manufacturing process, thereby reducing the manufacturing cost.

Since the height of the post can be easily changed, the height of the post can be adjusted to the size of the inductor in the lead frame according to the present embodiment, leading to size reduction.

In the conventional resin multilayer laminated substrate, an inner electrode and an outer electrode are connected via a through hole. By contrast, in the lead frame according to the present embodiment, an inner electrode and an outer electrode are connected through a post. When a through hole is used, the process of boring using a laser is additionally required to increase the size of the through hole, resulting in high cost. By contrast, the post is easily increased in size and easily improves heat dissipation with lower cost. In the case of the resin multilayer laminated substrate, the thickness of the interconnection layer serving as an inside electrode or an outer electrode is about 10 to 50 μm, whereas in the lead frame according to the present embodiment, the thickness of the inner lead or the outer lead can be set to about 100 μm to 200 μm. The lead frame according to the present embodiment therefore can easily achieve improved heat dissipation with lower cost.

The inner lead according to the present embodiment is formed such that the connected portion with the frame part of the inner lead frame is thin. This configuration can reduce the area of the inner lead exposed outside when a module of the component-embedded substrate is completed by dividing into small pieces and cutting off the inner lead from the frame part, thereby alleviating deterioration in electrical characteristics of the inner lead due to corrosion or the like.

In the lead frame according to the present embodiment, grooving is performed between the unit lead modules to expose the side surface of the outer lead, and plating is performed in this state. Thus, not only the electrode surface but also the side surface of the outer lead is plated. A solder fillet is then formed when the component-embedded substrate is mounted on a circuit board, thereby improving the mounting reliability of the component-embedded substrate.

The component-embedded substrate according to the present embodiment is entirely molded with an inorganic filler-containing resin and thereby achieves improved heat dissipation on the surfaces. In the lead frame according to the present embodiment, the use of a magnetic material-containing resin as the encapsulating resin to encapsulate improves the inductance.

The component-embedded substrate according to the present embodiment can contain a conventional external component by arranging a passive component such as capacitor and resistor on the inner electrode. With the passive component embedded, components can be densely arranged, leading to downsizing of the package of the circuit using the component-embedded substrate according to the present embodiment.

Modification

The lead frame 10 illustrated in FIGS. 1, 2A, and 2B may have the arrangement below. The converter IC 22 or the passive component 21 is arranged on the surface on the outer lead 11 side of the inner lead 13 of the lead frame 10. The inductor 20 is installed on the surface of the inner lead 13 of the lead frame 10 that is exposed from the encapsulating resin 14.

In this way, the position of the passive component or the active component and the position of the inductor in the component-embedded substrate may be reversed. Even in such a case, the similar effects as in the first embodiment, such as improvement in heat dissipating efficiency, can be achieved.

Second Embodiment

Figure 21A:
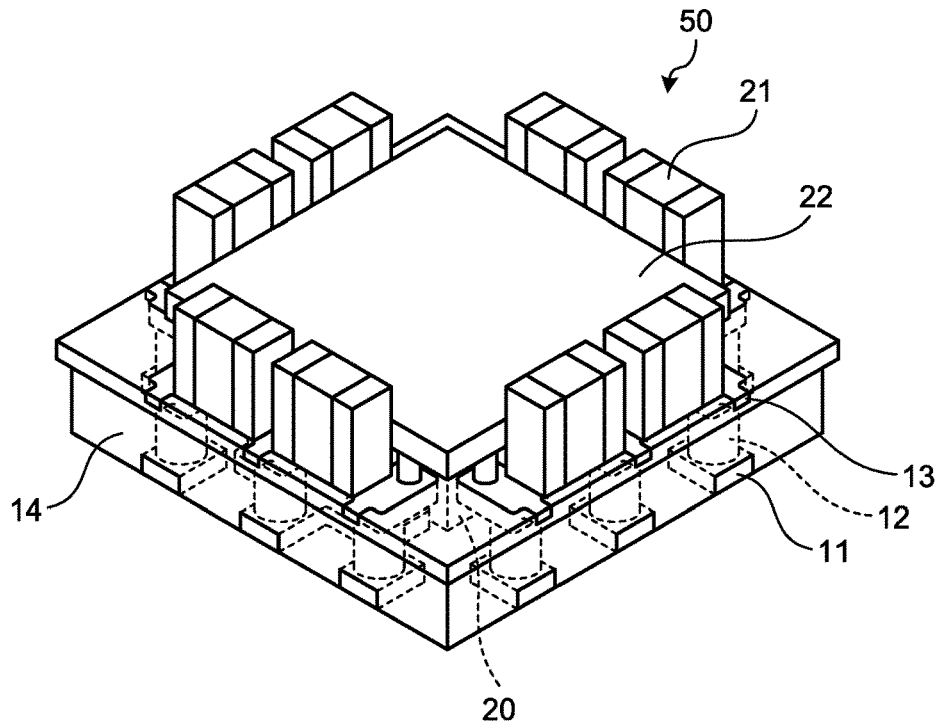
FIG. 21A is a perspective view of the front surface side of a component-embedded substrate according to a second embodiment.
Figure 21B:
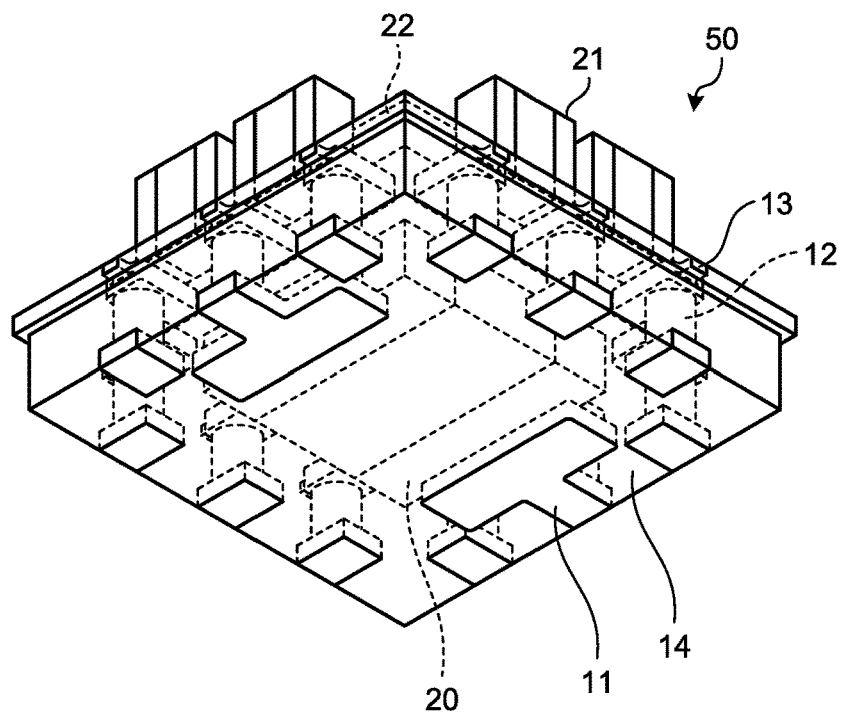
FIG. 21B is a perspective view of the back surface side of the component-embedded substrate according to the second embodiment.
Figure 22:
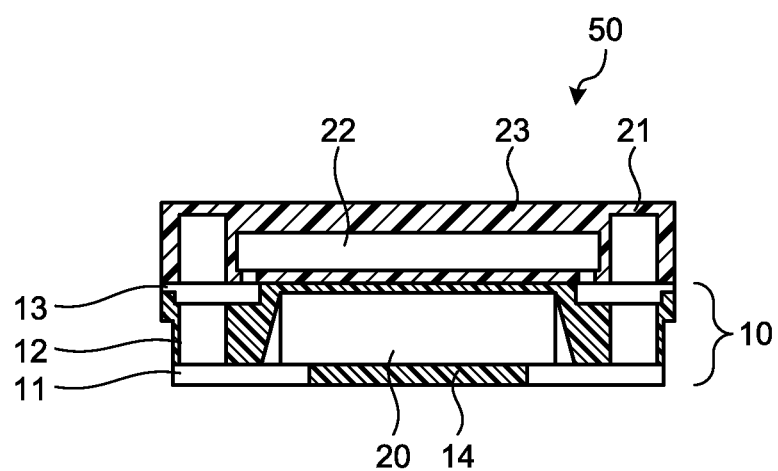
FIG. 22 is a schematic cross-sectional view of the component-embedded substrate according to the second embodiment.

FIG. 21A is a perspective view of the front surface side of a component-embedded substrate according to a second embodiment. FIG. 21B is a perspective view of the back surface side of the component-embedded substrate according to the second embodiment. FIG. 22 is a schematic cross-sectional view of the component-embedded substrate according to the second embodiment.

A component-embedded substrate 50 according to the present embodiment has outer leads 11, posts 12, inner leads 13, a encapsulating resin 14, an inductor 20, a passive component 21, a converter IC 22, and a encapsulating resin 23, in the same manner as the first embodiment. It is noted that the encapsulating resin 23 is not illustrated in FIGS. 21A and 21B in order to illustrate the structure simply. In the following description, the functions of the parts having the same reference signs as in the first embodiment will not be further elaborated.

In the component-embedded substrate 50 according to the present embodiment, as illustrated in FIGS. 21B and 22, the inductor 20 is connected to the outer lead 11. Here, in the present embodiment, when a lead frame including the unit lead frame 10 illustrated in FIG. 22 is manufactured, the same method as in the foregoing first embodiment is performed. However, in the present embodiment, the outer lead 11 includes a member having a region connected with the inductor 20. In the process of mounting the inductor 20 described with reference to FIG. 13, an electronic component mounter solders the inductor 20 to the outer lead 11 having a region connected with the inductor 20. In this case, as illustrated in FIG. 22, the inductor 20 can protrude toward the inner lead 13 by the amount of the thickness of the inner lead 13.

As described above, in the component-embedded substrate according to the present embodiment, the inductor and the inner lead can be overlapped in the thickness direction of the component-embedded substrate. This configuration can reduce the height and can achieve a smaller size.

Third Embodiment

Figure 23A:
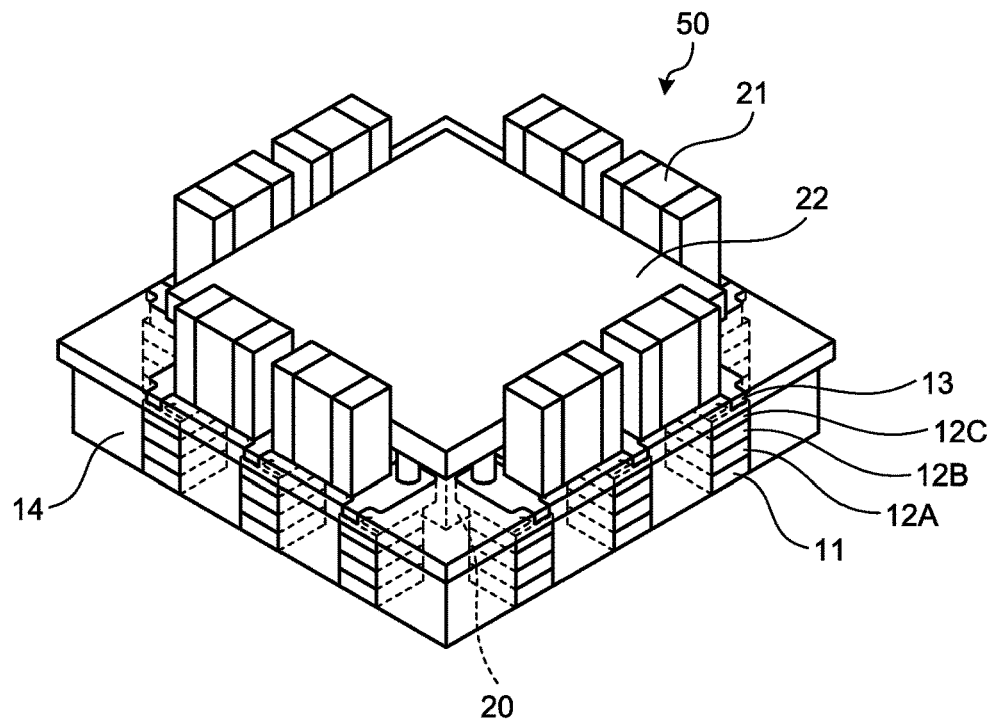
FIG. 23A is a perspective view of the front surface side of a component-embedded substrate according to a third embodiment.
Figure 23B:
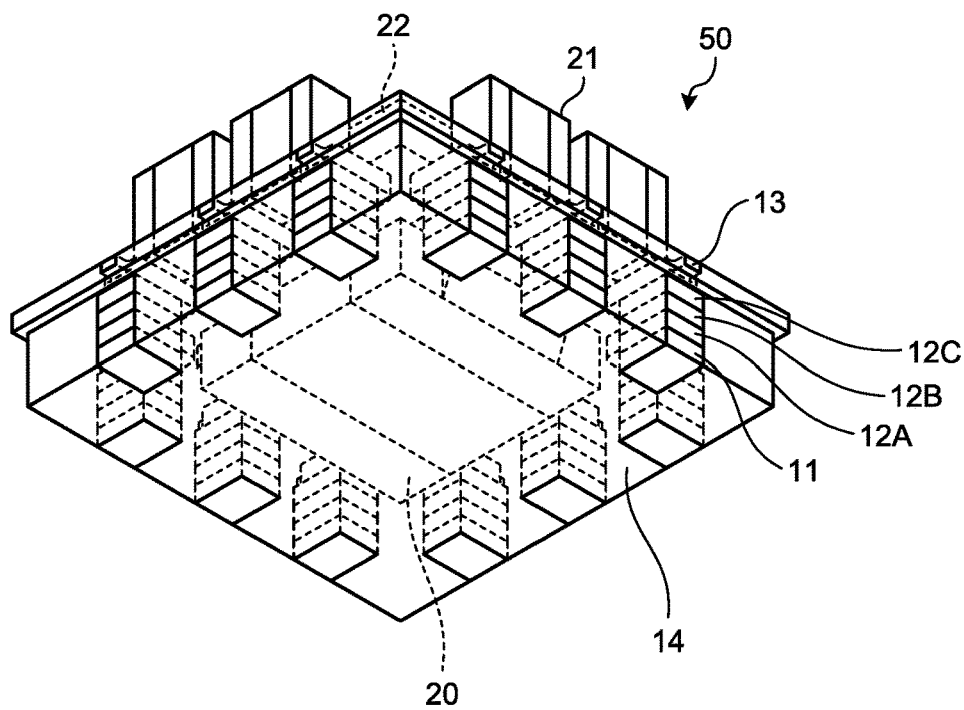
FIG. 23B is a perspective view of the back surface side of the component-embedded substrate according to the third embodiment.
Figure 24:
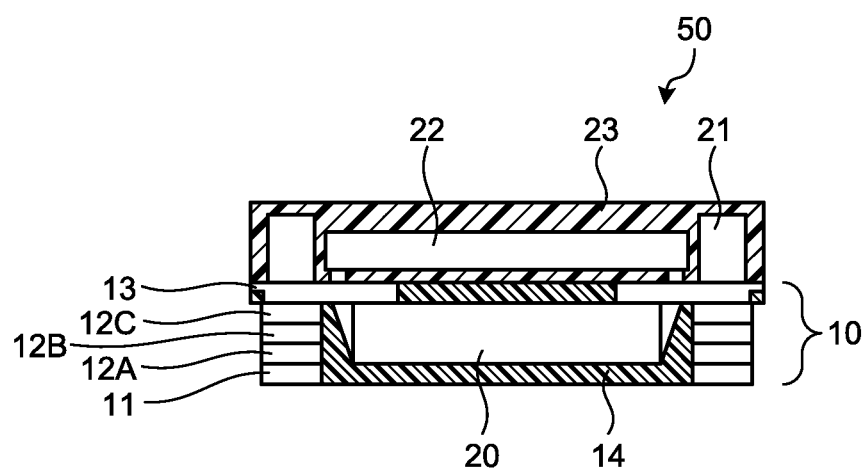
FIG. 24 is a schematic cross-sectional view of the component-embedded substrate according to the third embodiment.

FIG. 23A is a perspective view of the front surface side of a component-embedded substrate according to a third embodiment. FIG. 23B is a perspective view of the back surface side of the component-embedded substrate according to the third embodiment. FIG. 24 is a schematic cross-sectional view of the component-embedded substrate according to the third embodiment.

A component-embedded substrate 50 according to the present embodiment includes outer leads 11, thick copper plates 12A to 12C similar to the outer leads 11, inner leads 13, a encapsulating resin 14, an inductor 20, a passive component 21, a converter IC 22, and a encapsulating resin 23. It is noted that the encapsulating resin 23 is not illustrated in FIGS. 23A and 23B in order to illustrate the structure simply. In the following description, the functions of the parts having the same reference signs as in the first embodiment will not be further elaborated.

In the component-embedded substrate 50 according to the present embodiment, the thick copper plates 12A to 12C are stacked to connect the outer lead 11 to the inner lead 13. The thick copper plates 12A to 12C are produced as a lead frame having a similar shape as the outer lead frame 100. Here, in the present embodiment, three thick copper plates 12A to 12C are used. However, the number of thick copper plates is not limited.

Here, in the present embodiment, when a lead frame including the unit lead frame 10 illustrated in FIG. 24 is manufactured, the same method as in the foregoing first embodiment is performed. However, in the present embodiment, when a metal substrate as illustrated in FIGS. 9 to 11 is produced, the outer lead 11, the thick copper plates 12A to 12C, and the inner lead 13 are stacked. Then, the stacked outer lead 11, thick copper plates 12A to 12C, and inner lead 13 are connected to each other. The thick copper plates 12A to 12C are formed from a lead frame similar to the outer lead frame 100. The outer lead 11 portion of the outer lead frame 100 corresponds to the thick copper plates 12A to 12C. In this case, the number of thick copper plates 12A to 12C may be adjusted to the desired height. The thick copper plates 12A to 12C may be displaced from each other.

As described above, in the lead frame and the component-embedded substrate according to the present embodiment, a plurality of thick copper plates are stacked to connect the outer lead with the inner lead. In this case, the height can be easily changed by adjusting the number of stacked thick copper plates. Furthermore, the shape can be changed in various ways according to limitations such as the shape of the inductor, by displacing the thick copper plates from each other. When the thick copper plates are arranged at the same position as the outer lead, the side surfaces of the thick copper plates can be exposed outside by grooving, in the same manner as in the outer lead. Thus, the side surfaces of the thick copper plates can also be plated, thereby further improving the mounting reliability of the component-embedded substrate.

According to an aspect, the present invention can improve the heat dissipating efficiency.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic component comprising:
   a metal member having an outer lead frame including an outer lead, an inner lead frame including an inner lead disposed at a position opposed to the outer lead, and a metal pillar disposed between the outer lead and the inner lead and connecting the outer lead with the inner lead;
   a component disposed in a space sandwiched between the outer lead frame and the inner lead frame and connected to the outer lead or the inner lead; and
   a resin member encapsulating the metal member and the component,
   wherein one end of the inner lead is exposed from a side surface of the resin member, and the one end of the inner lead is thinner in thickness and smaller in width than another portion of the inner lead.

2. The electronic component according to claim 1, wherein the metal pillar is one metal piece.

3. The electronic component according to claim 1, wherein the metal pillar is formed with a stack of a plurality of metal pieces.

4. The electronic component according to claim 1, wherein a back surface of the outer lead is exposed from a back surface of the resin member, and one end of the outer lead is exposed from the side surface of the resin member.

5. The electronic component according to claim 4, wherein the back surface and the one end of the outer lead are plated.

6. The electronic component according to claim 1, wherein a front surface of the inner lead is exposed from a front surface of the resin member.

7. The electronic component according to claim 6, wherein the front surface of the inner lead is plated.

8. The electronic component according to claim 1, wherein
   a lower end of the metal pillar is bonded to a front surface of the outer lead,
   an upper end of the metal pillar is bonded to a back surface of the inner lead, and
   a side surface of the metal pillar is covered by the resin member.

9. The electronic component according to claim 1, wherein the outer lead, the metal pillar and the inner lead are bonded to each other using diffusion bonding.

10. The electronic component according to claim 1, wherein the outer lead, the metal pillar and the inner lead are bonded to each other by solder or metal paste.

11. The electronic component according to claim 1, further comprising a frame member having a plurality of frames to each of which the one end of the inner lead of each of a plurality of the metal members is connected, wherein
   the component is connected to the metal member for each of the frames, and
   the resin member encapsulates the metal members connected to the frames of the frame member and a plurality of the components.

12. The electronic component according to claim 11, wherein the resin member has a groove to expose a surface on one end of the outer lead.

13. The electronic component according to claim 1, wherein the resin member is a magnetic material-containing resin.

14. The electronic component according to claim 1, wherein the component is a passive component or an active component.

15. The electronic component according to claim 1, wherein another component is connected to a surface of the inner lead exposed from the resin member.

16. The electronic component according to claim 15, further comprising another resin member that is disposed on a surface of the resin member to encapsulate the another component.

17. The electronic component according to claim 1, wherein the resin member has a first side surface and a second side surface located more inward than the first side surface, the one end of the inner lead is exposed from the first side surface, and one end of the outer lead is exposed from the second side surface.

18. A method of manufacturing an electronic component, the method comprising:
   forming an outer lead frame including an outer lead and an inner lead frame including an inner lead such that one end of the inner lead is thinner in thickness and smaller in width than another portion of the inner lead;
   sequentially stacking and bonding the outer lead frame, a metal pillar, and the inner lead frame to form a metal member;
   arranging a component in a space sandwiched between the outer lead frame and the inner lead frame and connecting the component to the outer lead or the inner lead; and
   encapsulating the metal member and the component with resin.

19. An electronic component comprising:
   a metal member having an outer lead frame including an outer lead, an inner lead frame including an inner lead disposed at a position opposed to the outer lead, and a metal pillar disposed between the outer lead and the inner lead and connecting the outer lead with the inner lead;
   a component disposed in a space sandwiched between the outer lead frame and the inner lead frame and connected to the outer lead or the inner lead; and
   a resin member encapsulating the metal member and the component,
   wherein the resin member has a first side surface and a second side surface located more inward than the first side surface, one end of the inner lead is exposed from the first side surface, and one end of the outer lead is exposed from the second side surface.

* * * * *